United States Patent [19]

Kasten et al.

[11] Patent Number: 5,317,260
[45] Date of Patent: May 31, 1994

[54] PROCESS FOR GENERATING A PULSE SEQUENCE

[75] Inventors: Arne Kasten, Karlsruhe; Günter Laukien, Rheinstetten, both of Fed. Rep. of Germany

[73] Assignee: Bruker Analytische Messtechnik GmbH, Rheinstetten, Fed. Rep. of Germany

[21] Appl. No.: 781,243

[22] PCT Filed: Jun. 15, 1990

[86] PCT No.: PCT/DE90/00457

§ 371 Date: Dec. 26, 1991

§ 102(e) Date: Dec. 26, 1991

[87] PCT Pub. No.: WO91/00530

PCT Pub. Date: Jan. 10, 1991

[30] Foreign Application Priority Data

Jun. 27, 1989 [DE] Fed. Rep. of Germany ....... 3920997

[51] Int. Cl.$^5$ ............................................ G01R 33/20
[52] U.S. Cl. .................................................. 324/309
[58] Field of Search ............... 324/300, 307, 309, 310, 324/311, 312, 313, 314, 318, 322

[56] References Cited

U.S. PATENT DOCUMENTS

| 4,296,378 | 10/1981 | King | 324/313 |
| 4,471,305 | 9/1984 | Crooks et al. | 324/309 |
| 4,599,565 | 7/1986 | Hoenninger, III et al. | 324/309 |
| 4,682,106 | 7/1987 | Vatis et al. | 324/307 |
| 4,695,798 | 9/1987 | Brandes | 324/307 |
| 5,195,525 | 3/1993 | Pelc | 324/309 |

FOREIGN PATENT DOCUMENTS

| 0195670 | 3/1986 | European Pat. Off. |
| 0287661 | 1/1987 | European Pat. Off. |
| 0268933 | 11/1987 | European Pat. Off. |
| 85/02264 | 11/1984 | World Int. Prop. O. |

OTHER PUBLICATIONS

IEEE Transactions on Biomedical Engineering, vol. BME-34, No. 12, Dec. 1987, IEEE, (New York, N.Y., US) D. Foxvog et al.: "PUPA: A pulse programming assistant for NMR imaging", pp. 938-942.

IEEE Transactions on Nuclear Science, vol. 36, No. 1, Feb. 1989, IEEE, (New York, N.Y., US), M. S. Roos et al.: "An instrument control and data analysis program configured for NMR imaging", pp. 988-992.

Patent Abstracts of Japan, vol. 9, No. 320 (P413) (2043), Dec. 14, 1985, & JP, A, 60146137 (Mitsubishi Denki K.K.), Aug. 1, 1985.

Primary Examiner—Michael J. Tokar
Attorney, Agent, or Firm—Thomas R. Vigil

[57] ABSTRACT

In order to simplify the process of plotting a pulse sequence controlling the course of an MR experiment, for example an NMR tomographic investigation, by which the excitation of an RF pulse bringing about transverse magnetization, the switching on and off of field gradients acting in different directions, superposed on a constant magnetic field, as well as the acquisition times, it is proposed to generate this pulse sequence by modification of standard pulse sequences and/or by composition from standard pulses. These pulses are offered on a picture screen (22) as simple symbols (42-49), icons, or brief designations for standard pulse sequences (36-41). By clicking-on of the offering fields, for example by means of a mouse (51), these elements can be copied on time axes (58) allocated to them and attached at the suitable release time point onto these axes. The pulse sequence thus determined is stored on-line. The input of parameters can occur by clicking-on of windows (57 and/or 61), into which the parameter values can be input. In an arrangement (10) suited for the execution of the process the icons (42-49) representing the standard pulses are arranged along an icon column (54) on the left image border of the picture screen (22), while standard pulse sequences (35-41) are recallable on a menu strip (56) along a "horizontal" border of the picture screen (22), represented by brief designations.

15 Claims, 2 Drawing Sheets

PROCESS FOR GENERATING A PULSE SEQUENCE

FIELD OF THE INVENTION

The invention relates to a method to generate a pulse sequence effecting, in an experiment or during an investigation based upon magnetic resonance, e.g. NMR or ESR, a triggering of control signals at predetermined times, by which physical quantities such as a polarizing magnetic field $H_o$, a carrier frequency, an amplitude and relative phase of an exciting electromagnetic RF field, gradient field generation in various coordinate directions, as well as detection times for the response signals resulting from the RF excitation of a sample or investigated object are controlled with respect to their sequence and time dependence, whereby a set of parameters, which can be processed and stored in a computer, and changed by means of an input device depending on the type of the experiment, is assigned to each of these physical quantities, through which set the chronologically controlled retrieval of these parameters generates the control signal and whereby an image symbol which can be displayed on a screen of an input device for the dialogue of the user with the computer is allocated to each parameter set which generates a control signal if called and whereby a time mark can also be displayed on the screen. The invention is also concerned with a device for carrying out this method.

BACKGROUND OF THE INVENTION

A method, for generating a pulse sequence as well as a device for its execution, is known from EP 0 287 661 A1. According to this publication, for example, the parameters: pulse shape, amplitude, and duration as well as the temporal order of the pulses of the sequence are entered via the input keyboard of the computer, and thereby the complete sequence is programmed.

Even though the generation of the pulse sequence is in principle simple, it appears to be, however, disadvantageous in the known method that the input of the numerous parameters is complicated for the user because it is time-consuming.

The known process would still be afflicted with this disadvantage even if, instead of a customary input keyboard, an arrangement further known from EP 0 026 833 A2 should be used for the data input, offering to the user a supply of parameters to be entered in the form of scales allocated to these individually on a screen, on which scales, by shifting, e.g. mouse-controlled, of an arrow representation or rotation of a pointer representation, he can mark an input parameter value and/or limit its range. The time expenditure required for a process modified in such a manner for a complete data input would correspond, however, at least to that which must be accepted by using the method known per se from EP 0287661 A1.

It is also known practice to define pulse sequences graphically by means of a so-called light pen. This, too, although it appears to be "more graphic" and thus simpler than an input of digital abstract values, is complicated and time-consuming inasmuch as, because of the strongly differing pulse durations of the control signals in the plotting of such a sequence, the time scale of the "drawing" has to be changed very frequently.

A method of the type mentioned at the outset is finally known from IEEE Transactions on Biomedical Engineering, vol. BME-34, No. 12, December 1987; D. Foxvog et al.: "PUPA: A pulse programming assistant for NMR imaging", pages 938-942. Here, after the selection and possible modification of a pulse or of a pulse sequence, which is possible only by means of the input keyboard of the computer, the pulses or the pulse sequence are displayed on a screen, so that further required modification is facilitated with the aid of the graphic representation.

SUMMARY OF THE INVENTION

The object of the invention is therefore to improve a method of the type mentioned above such that the establishing of a sequence of control signals adapted to the experiment is considerably simplified for the user, as well as to provide for a device to execute this improved method.

This object is basically achieved with respect to the method by attaching the image symbol to the time mark and thus defining the point in time at which said parameter set is retrieved to generate said corresponding control signals allocated to the physical quantity and that the input and/or changing of a particular parameter set is effected by opening at least one window on said screen allocated to at least one of said image symbols corresponding to said particular parameter set and entering data into window fields of said window for the parameters of said particular parameter set.

In an advantageous application and embodiment of this basic principle the generation of the magnetic resonance pulse sequence is effected by changing of standard pulse sequences whose parameter sets are stored in the computer and which are retrievable and can be displayed on the screen. It is preferred that generation of the magnetic resonance pulse sequence is effected by combining standard pulse sequences and/or by entering at least one additional standard pulse sequence into a standard pulse sequence which is predefined as being changeable.

By the possibility given according to the invention of composing a needed sequence of control signals from elements prepared by subprograms, for example by variation of standard pulse sequences which are kept ready for frequently occurring types of experiments and investigation as offering and/or by putting together the pulse sequence from standard pulses of which also the standard pulse sequences (can) consist, the plotting of the needed sequence of control signals is considerably simplified. Programming operations in the sense of an input of parameters are required only insofar as pulse sequences and/or elements of such offered with standard specifications still require an adaptation for the execution of the intended experiment.

Representation of the sequence of control signals is simplified by a reduction of the number of time axes without impairing the completeness of the representation where in a display on the screen a common time axis is allocated to pulses which each control one of the physical quantities via a common output channel; by displaying in a display of the total magnetic resonance pulse sequence only those pulses by an image symbol whose time sequence determines the course of the magnetic resonance experiment; and thus "renouncing" the representation of parameters which remain essentially constant during the experiment and by the "shortening" of the time axis needed for the representation which makes it possible to present the pulse sequences on a relatively larger scale whereby in a display of the total magnetic resonance pulse sequence time intervals where all control signals are constant are not displayed at full length but represented by representations of shortened time intervals such that the sequence of individual pulses is preserved whereby the non-displayed time intervals are replaced by shorter window symbols, the corresponding windows containing the information about the length of the non-displayed time interval.

With respect to the apparatus for performing the method according to the invention, the object mentioned above is achieved by an apparatus for performing the method with electronic control means which generate control signals from stored parameter sets by means of a programmable computer, by which control signals functional components of the apparatus—transmitter, magnet, gradient system, and receiver means—can be controlled in a sequence adapted to the purpose of an experiment or a routine investigation in order to adjust the physical quantities, whereby, for the dialogue between on the one hand the computer (36), with its storage means, and on the other hand the user, retrieval and input means are provided comprising a screen where image symbols (42 through 49) can be displayed inside a symbol field (54), representing a store of standard pulses and/or sequences, whereby the time sequence of standard pulses and/or sequences can be determined by transfer of the image symbols (42 through 49) onto time axes (58), representing control channels in the display on the screen and/or by shifting such symbols along the time axes, whereby the control signals represented by the image symbols are generated and/or repeated if necessary after a start command, comprising control means (51,52) to shift a cursor (53) to select individual image symbols (42 through 49) and to place them on the time axes (58), and comprising input means (62) to specify the symbolically represented pulses with respect to their characteristic parameters—e.g. pulse height, width, time profile of increasing and decreasing slope.

In this apparatus the insertion of standard pulses into a standard pulse sequence to be altered and/or the arrangement of standard pulse symbols on time axes for the generation of a desired pulse sequence occurs by means of a curser. This shifting can be performed by means of the curser keys of a usual input keyboard which is, however, in many respects complicated.

In contrast, by using a mouse or a joystick as control means to open windows by clicking on the symbol field or an image symbol on a time axis which windows contain parameter fields which again can be clicked on to be inspected or to change parameters as well as control fields which control the programming of the computer and the storing of the window parameters if clicked on, a further simplification of the selection of sequence elements and their arrangement on the time axes is achieved, whereby the use of a mouse also permits a "graphic" definition of "special" pulse elements.

Combination of arranging image symbols representing standard pulses in a "vertical" image symbol column by using a symbol field which is represented as an image symbol column located along a vertical margin of the screen and where horizontal time axes are displayed within stripes occupied by individual image symbol fields and using standard image symbols representing standard pulses or standard pulse sequences which can only be placed onto predetermined time axes and shifted along these time axes and restricting the standard image symbols so that they can only be placed onto and/or shifted along one single time axis provides in a simple manner, safety means against "false programming".

A menue line can be displayed containing fields corresponding to individual standard pulse sequences and, on clicking on one of the fields, the corresponding standard pulse sequence can be called to the screen. This menue line for the selection of standard pulse sequences from the screen can be supplemented by options whose selection and specification define measures which are required for a large number of pulse sequences, for example repetition of pulse sequences, breaking-off of the repetitions when a predeterminable signal-to-noise ratio is reached, as well as control of incremental changes of individual pulse parameters in successive reception cycles which are controlled by the particular sequence of control signals.

Further details and features of the invention are apparent from the following description of a special embodiment of the method according to the invention and device for its execution.

DESCRIPTION OF THE PREFERRED EMBODIMENTS

Figure 1:
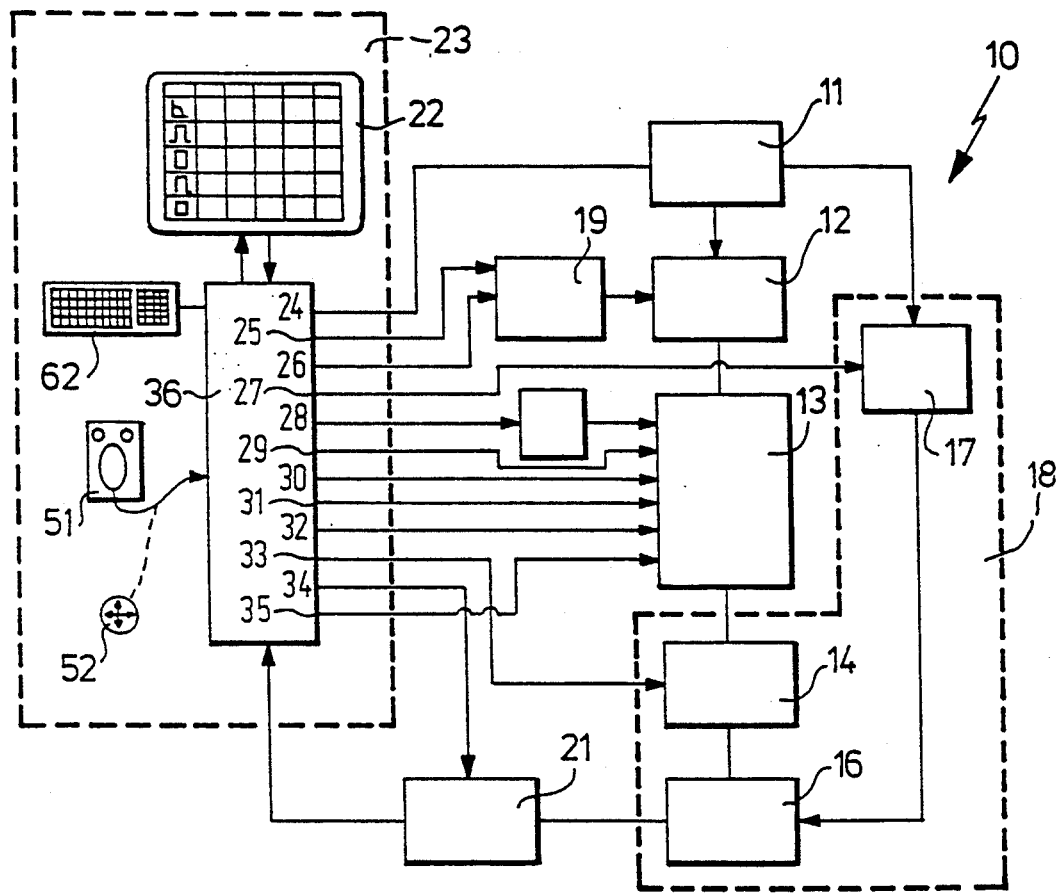
FIG. 1 shows a schematically simplified block circuit diagram of a device according to the invention in the particular form of an NMR spectrometer and FIG. 2 shows a plot on a screen of a special sequence of control signals in order t explain the function of the spectrometer according to FIG. 1 and of a special embodiment of the method according to the invention.

The magnetic resonance apparatus represented in FIG. 1 as a simplified block circuit diagram, designated as a whole with 10, comprises functional components which, with the functions explained below, are intended both for a nuclear magnetic resonance (NMR) spectrometer for scientific experiments, but can also be provided in an NMR tomograph operating with nuclear magnetic resonance, which is meant primarily for purposes of medical diagnosis and, therefore, for rather routine examinations.

The magnet always present in such MR systems 10, which generates a constant magnetic field of high field strength and homogeneity to which a sample or—in the case of tomography—parts of a human or animal organism are exposed, is, in the interest of simplicity, not shown. Such magnets are today frequently constructed as cryomagnets with superconducting windings, which, once charged with a super-current which generates a magnetic field of desired field strength, are maintained over a relatively long time, for example a year, in the superconducting state, without further intervention for control into the magnetic system of issue here.

Only the functional components are represented with which experimental quantities are fixed and/or varied during an experiment or an investigation with respect to their magnitude and time dependence. These are, embodied in electronic circuitry technique and functional combination known per se at least the following functional units:

1. A high-frequency (RF) transmitter 11, which generates a coherent electric RF output signal with adjustable predeterminable frequency $\Omega_0$.

2. A controllable power amplifier 12 connected to the output of the RF transmitter 11, 3. A region 13, which may be called "investigation volume" in an NMR tomograph and "probe head" in an NMR spectrometer within which the investigated object can be permanently or temporarily subjected to the physically influencing quantities relevant for the particular experiment or the intended investigation as for example, the following:

a) a quantitatively relatively slight increase or decrease of the field strength of the magnetic field generated by the magnet of the NMR system 10, whose direction defines the "longitudinal" direction of the magnetic polarization as the Z-direction in a cartesian coordinate system.

b) magnitudes, signs and periods of activity of field gradients Gz, Gx as well as Gy, which can be generated in the longitudinal Z-direction as well as in the X and Y directions transverse thereto.

c) A first RF field which may be introduced by means of a transmitter coil (not shown) fed by the power amplifier 12, for the resonant excitation of a transverse magnetization in a desired frequency range.

d) A second, likewise transverse RF field, by which in order to achieve a decoupling of magnetic transitions of interest from interfering transitions a saturation of a resonantly excitable magnetization state in a further frequency range is achievable.

4. A receiver device, designated as a whole with 18, comprising a receiver coil (not shown), a controllable preamplifier 14 and a phase-sensitive detector 16 connected to its output and a controllable phase shifter 17, with which the RF output signal of the RF transmitter (11) is fed to the phase-sensitive detector 16 as a reference signal said receiver arrangement, for example after termination of an excitation of the transverse magnetization in the sample head 13 generating electric output signals reflecting its change and decay characteristics from which, after processing and evaluation, according to known criteria, the information data determinable from the experiment or investigation can be recovered.

5. A pulse modulator 19 acting on the power amplifier 12, by means of which the amplitudes of the output signal of the power amplifier 12 driven with the carrier frequency $\Omega_0$ of the RF transmitter 11 can be modulated with a "square" or smoothly curved, for example a "bell-shaped" profile corresponding to a Gauss curve, given in the time domain.

By this pulse modulation of the RF output signal of the power amplifier 12, as seen in the frequency domain, the energy of the exciting RF field is distributed "on both sides of" the carrier frequency $\Omega_0$ over a band width that is greater the shorter the duration of the modulation pulse, where the amplitude distribution is determined within this band width according to the Fourier theorem by the form of the modulation imposed, given in the time domain, or as known per se (DE-C 24 14 551).

6. A computer 21, which performs a Fourier transformation of the output signal of the phase sensitive detector 16 and generates an output which is representable graphically as a frequency spectrum of the excited resonance processes, for example by means of a monitor 22, or may be documented in other suitable manner, for example as a print-out.

7. An electric control arrangement designated as a whole with 23, which emits control signals in a programmable sequence to a plurality of outputs allocated to the functional units 11,12,13,18,19 and 21 explained above; by these control signals the functional units are activated in a time sequence and duration determined by the pulse sequence for the onset of the physical quantities required for the particular type of NMR experiment or investigation according to quality and time correlation, to which also belong the detection time window of the receiver arrangement 18 as well as the activation time of the computer 21.

Figure 2:
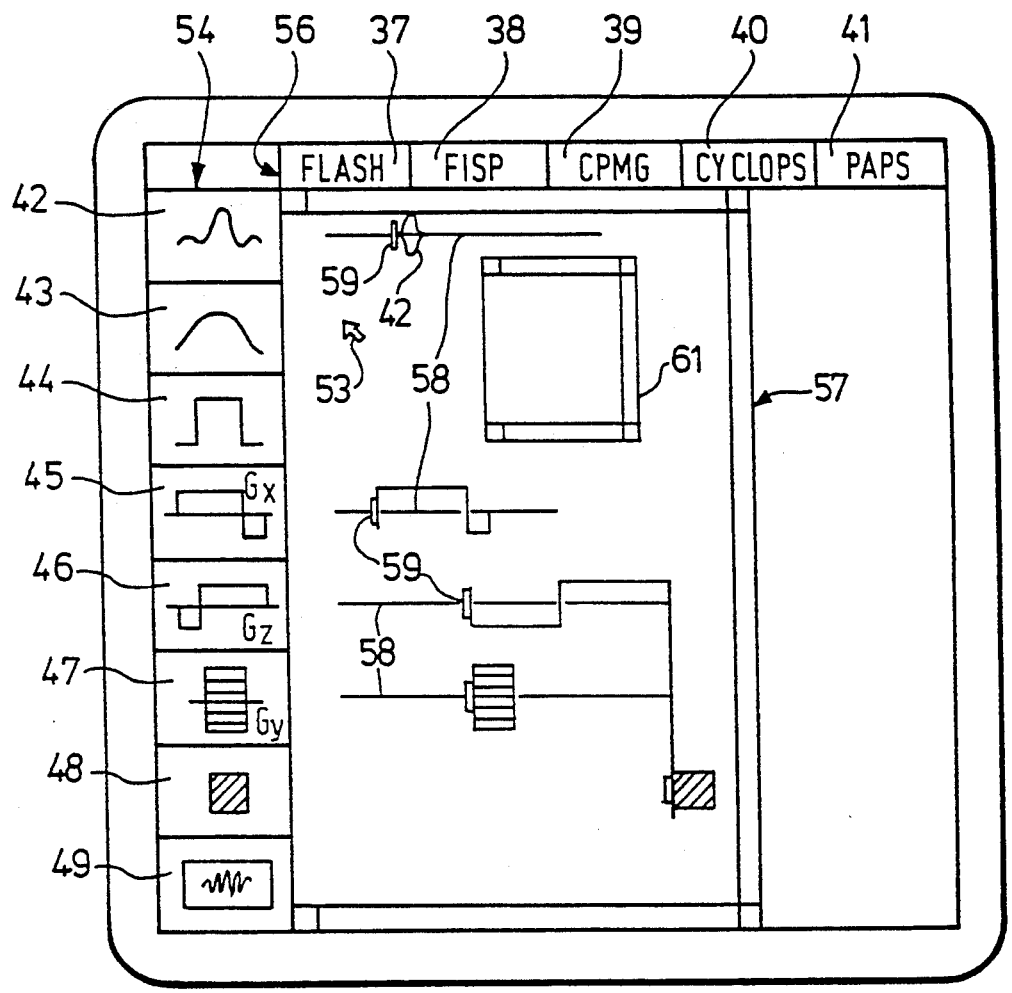

For the explanation of the electronic control arrangement 23, we now refer to the details in this 20 respect of FIG. 2, with the aid of which a typical method is described which makes possible a simple programming of the pulse sequences emitted by the outputs 24 to 35 of the control arrangement 23.

It is assumed that it is sufficient to explain the control arrangement 23 by its functions, whose realization is possible for a correspondingly trained specialist who knows the purpose of the control arrangement 23 by well known means of electronic circuit technology.

The control arrangement 23 comprises a programmable computer 36 with a storage unit in which standard pulse sequences 37 to 41 suited for various pulse NMR experiments are stored, which are convertible over an output mechanism represented by the outputs 24 to 35 of the computer 36 into the control (voltage) signals required to drive the functional units 11,12,13,18 and 19 as well as 21 of the NMR arrangement. These standard sequences are, as a rule, subcombinations of a set of standard pulses 42 to 49 as well as sequences of such pulses, from which the sequences are so to speak "composed". The pulse sequence coming into use for a certain NMR experiment or also a tomographic investigation, requires in general an experiment-specific establishing of the characteristic parameters of its standard pulses, for example with respect to pulse shape, pulse height and pulse duration, alteration of one or more of these parameters in the course of successively following triggerings of the particular pulse sequence, etc. and thus a "programming" of its own.

The dialogue required in this respect between user and computer occurs in the manner known from PC (personal computer) technology by means of a mouse 51 or of a joy stick 52 which shift a cursor 53 on the screen 2 onto image symbols that are allocated to the individual standard pulses, whereby these are selectable for input or for a change of their characteristic parameters. The image symbols allocated to the standard pulses 42 to 49 for which in the following the same reference signs are used as for the standard pulses 42 to 49, are represented according to the representation of FIG. 2 on the left margin of the screen 23 in an image symbol column designated as a whole with 54.

Standard sequences 37 to 41 corresponding to various subcombinations of standard pulses 42 to 49 are reproduced in a menu strip running along the upper screen margin, designated as a whole with 56 by their usual brief designations.

As examples for such standard pulses there are given:

The standard sequence 37—"FLASH" (fast low angle shot).

The standard sequence 38—"FISP" (fast imaging with steady precession)

The standard sequence 39—"CPMG" (Carr-Pucell-Meiboom-Gill sequence).

The standard sequence 40—"CYCLOPS" (quadrature phase cycling) and

The standard impulse sequence 41—"PAPS" (phase Alternating Pulse Sequence).

It is self-evident that the image symbols 42 to 49 or brief designations of standard pulse sequences 37 to 41 given in the image symbol column 54 and in the menu strip 56 of the screen representation according to FIG. 2 are merely to be understood as examples and by no means as conclusive "listings" of the possible image symbols or standard pulse sequences.

Of the standard pulse sequences 37 to 41 cited in the menu strip 56 the first two—FLASH and FISP—are those of imaging in NMR tomography, while the three last-mentioned standard pulse sequences are for NMR pulse Fourier spectroscopy.

In a typical procedure for the programming of the NMR arrangement 10 for a tomographic investigation, for example according to the FLASH process, the following procedure can be followed:

By approaching the field allocated to this standard pulse sequence 37 of the menu strip 56 with the pointer 53 of the mouse 51 and clicking-on this field 37 there is opened a window designated as a whole with 57 on the screen 22, which offers a graphic representation of the control signals used in this process. These control signals are reproduced inside the window 57 in the representation corresponding to the image symbols 42 to 49. They are reproduced there along "parallel" time axes 58, which are allocated to the respectively used outputs of the computer 36 of the control arrangement 23.

These are, according to the representation of FIG. 2, as seen from the top downward, the output 25 for the drive signal of the pulse modulator 19, the output 31 for the slice-selection gradient Gx, the output 30 for the read gradient Gz, the output 32 for the phase encoding gradient Gy, the output 35 for the spoiler gradient 48 and the output 33 for the acquisition window 49.

In the representation of the pulse sequence 37, for the sake of clarity, time axes 58 and image symbols 42 and 45 to 49, representing the individual pulses, are represented only insofar as necessary for the programming of the time sequence of the individual pulses, which can be effected by shifting the image symbols 42 and 45 to 49 along their time axes 58 attaching to these by setting time marks 59, whereby it is, of course, understood that time marks 59 arranged on top of each other represent identical time points in the representation of the time axes 58.

Output signals and their time dependencies, emitted at further outputs 24, as well as 26 to 29 and 34 of the computer 36 can, if need be, be representable in one or more subwindow(s) 61 of the total representation window 57.

If need be, in the sub-window 61 further windows can be opened in which by graphic symbols and/or data tables properties of the particular control signal can be given. At times, such a sub-window 61 can occupy the entire screen depending on how complex the set of parameters is which specifies the particular control signal.

An input or change of the parameters characterizing a (standard) pulse of the pulse sequence occurs within the window 57 or 61 in which this parameter is also recallable.

The input or change of parameters can occur graphically and/or numerically, the latter through input of the numerical data via the keyboard 62 of the computer 36.

In this regard, the "programming" of the excitation pulse 42 of the pulse sequence 37 occurs by clicking-on the image symbol 42 of the same type in the image symbol column 54, whereupon the relevant image-symbol sub-window 61 is opened in which there are provided fields for the input of its characteristic data, namely a field for 1. Pulse height, 2. Pulse width or duration, 3. Time point of the onset or time shift of the same against a relevant time mark 59, 4. Carrier frequency $\Omega_0$ of the excitation RF as well as, 5. Pulse angle $\alpha$ about which the excitation pulse rotates the magnetization, and 6. relative phase of the pulse, with respect to the relevant reference frequency.

Other properties of an excitation pulse 42, the programming designation or input of which can be of importance for further NMR experiments and/or investigations, are the functional purpose—for example to select chemical shift or generate a representation range—as well as the frequency and amplitude distribution of the properties determining the RF excitation spectrum such as pulse shape—for example Gauss shape 43 or square shape 44 and, in particular in combination with the latter, pulse height and pulse width for the definition of the property "soft" or "hard".

In an analogous manner, the gradient pulses 45, 46 and 47 can be represented graphically and/or by characteristic numerical data and be programmed by their acceptance or change. In this case also the blending-in of the time function of the rise of the gradient current with the possibility of observing the effect of the parameter changes on the graphic respresentation is of special interest. When clicking-on the acquisition window pulse 49, in the allocated window 61, all data of the signal reception are shown such as start and end of the signal acquisition, time parameters of the transmit-to-receive switching, the reception channels, the receiver phase, data of the filtering, of the spectral band width, as well as number and spacing of the digitalization points for the received signals.

Sequences of control signals, however, can be programmed not only by input or alteration of characteristic parameters for standard sequences 37 to 41 already "offered" according to their basic type in the control arrangement 23, but can also be generated by copying of the individual image symbols 42 to 49 onto the time axis 58 in suitable numbers and combinations, in which case establishing of the characteristic parameters in each case occurs again in the allocated windows 61 and, if need be, in subwindows, as already explained above. Likewise, from standard sequences 37 to 41 present in stock, partial sequences can be copied and inserted into an existing sequence and/or further pulses, available in the image symbol column 54, can be inserted into such a standard sequence and fixed to the suitable time marks on the time axes 58. Here, standard sequences or partial sequences can also be represented "abbreviated", i.e. essentially by a symbol that only shows its specific content by "clicking-on". Insofar as a pulse is not available in storage, it can be defined graphically and/or by input of its numerical data and be stored as a quantity recallable by itself.

Properties of a sequence of control signals, such as, for example their repetition, which cannot be combined via image symbols and corresponding windows can be "clicked on" on a separate, further menu strip (not represented) and quantified by input of corresponding data on window fields allocated to these.

In sequences of control signals that are repeated quasi-periodically in such a way that one or more of their pulse parameters are altered, the number of periodic repetitions required for the achievement of a certain signal-to-noise ratio is fixed or established as desired by observing the improvement in the signal-to-noise ratio on the monitor. The image symbol of the quantity that is changed, is expediently marked by color or by a reversed representation. In a window allocated to the change, for example, a phase cycle or the increment of a gradient which is to change in the course of a total investigation can be established.

It is also useful to emphasize pulses which are externally triggered by color or by reversed representation. Inside a window provided for the generation of parameters of such pulses, it is then specified that the shift with respect to a reference time mark (trigger) is variable.

For a compact representation of a sequence of control signals, it is useful to shorten the time axes within the time intervals in which "nothing happens". The interval "removed" in such a manner from a time axis can be characterized by a small window with indication of the interval duration, this interval duration, too, being variable by clicking-on the window and by entering the interval duration by means of the keyboard 62.

The computer 36 changes the progamming of the control arrangement 23 either on-line or on closing of a window 57 or 61, or only after conclusion of the generation of the total sequence. In this step, it is examined whether the sequence can be realized by the hardware on hand, or whether it falls out of the framework of the usual or is even associated with danger to damage part of the apparatus 10. In the last case a warning and, under some circumstances, the refusal to convert the sequence, is given by the computer.

It is useful that the pulse sequence is documented together with the measuring file, so that also in a later stage, the sequence linked to a certain measuring result can be reconstructed clearly and vividly. Moreover, provisions are taken that a pulse sequence generated in this way and recognized as advantageous is completely stored and thereby added to the stock of "standard pulse sequences".

We claim:

1. An improved method for generating a magnetic resonance pulse sequence for the investigation of a sample by a magnetic resonance experiment, said method including the steps of triggering a control signal from electronic control means of a magnetic resonance apparatus at a predetermined time to generate a physical quantity having individual properties and a location in time with respect to a common starting point in time; setting in a programmable computer of the magnetic resonance apparatus a parameter set, having parameters, allocated to the physical quantity and to the control signal, the parameter set being processed and stored in the computer, and, during a magnetic resonance pulse sequence, a chronologically controlled retrieval of the parameter set generates the control signal; allocating an image symbol to the parameter set, the image symbol being displayed on a screen of a computer monitor, and attaching a time mark to the image symbol, the time mark also being displayed on the screen, the improvement comprising:

allocating a window to the image symbol; setting the time mark to define a point in time at which the parameter set allocated to the control signal and to the physical quantity is to be retrieved; opening the window to input a particular parameter set, the window being on the screen; and entering data into a window field of the window for setting the parameters of a particular parameter set.

2. Method according to claim 1, characterized in that the parameter set allocated to the physical quantity comprises an amplitude and a relative phase of at least one rf pulse.

3. Method according to claim 2, characterized in that the parameter set further comprises information about a typical shape of at least one rf pulse and in that the image symbol is allocated to that typical shape.

4. Method according to claim 3, characterized in that the parameter set further comprises information about a magnetic gradient field.

5. Method according to claim 1, characterized in that the generation of the magnetic resonance pulse sequence is effected by changing a standard pulse sequence whose parameter sets are stored in the computer and which are retrievable and can be displayed on the screen.

6. Method according to claim 5, characterized in that the generation of the magnetic resonance pulse sequence is effected by adding at least one additional standard pulse sequence to a standard pulse sequence which is predefined as changeable.

7. Method according to claim 1, characterized in that, on a display on the screen, a common time axis is allocated to pulses which each control one of the physical quantities via a common output channel.

8. Method according to claim 1, characterized in that in a display of the total magnetic resonance pulse sequence only those pulses are displayed which are represented by an image symbol whose time sequence determines the course of the magnetic resonance experiment.

9. Method according to claim 1, characterized in that in a display of the total magnetic resonance pulse sequence on the screen, time intervals where all control signals which are constant are not displayed at a full length but are replaced by shortened time intervals that preserve the sequence of individual pulses in the sequence, and the non-displayed time intervals are replaced by windows containing information about the length of the non-displayed time interval.

10. An improved magnetic resonance apparatus using a magnetic resonance pulse sequence for the investigation of a sample by a magnetic resonance experiment, said magnetic resonance apparatus including: electronic control means to generate from parameter sets, having parameters, stored in a programmable computer, control signals for control channels, the control signals on said control channels controlling functional components of the magnetic resonance apparatus to generate and/or to change physical quantities necessary for the magnetic resonance pulse sequence of the magnetic resonance experiment, the improvement comprising a screen where image symbols representing standard magnetic resonance pulses and/or standard magnetic resonance pulse sequences for the generation and/or the change of the physical quantities, can be displayed inside a symbol field, and the time sequence of magnetic resonance standard pulses and/or of standard magnetic resonance pulse sequences is determined by transfer of the image symbols onto time axes on the screen representing control channels or by shifting them along these time axes, and the control signals generated from the stored parameters and represented by the image symbols are generated and/or repeated after a start signal; control means to shift a cursor to select individual image symbols and to place them onto the time axes, and input means for inputting properties of magnetic resonance pulses and/or magnetic resonance pulse sequences to modify their parameter sets.

11. Apparatus according to claim 10, characterized by including a mouse or a joy stick as control means to open windows by clicking on the symbol field or an image symbol on a time axis, the windows containing parameter fields which again can be clicked on to be inspected or to change parameters as well as control fields which control the programming of the computer and the storing of the parameters in the window if clicked on.

12. Apparatus according to claim 10, characterized by including a symbol field which is represented as an image symbol column located along a vertical margin of a screen and where horizontal time axes are displayed within stripes occupied by individual image symbol fields.

13. Apparatus according to claim 12, characterized by including standard image symbols representing standard pulses or standard pulse sequences which can only be placed onto predetermined time axes and shifted along these time axes.

14. Apparatus according to claim 13, characterized by including a standard image symbol which can only be placed onto or along one single time axis.

15. Apparatus according to claim 10, characterized by including a menu line which can be displayed containing fields corresponding to individual standard pulse sequences and, when clicking on one of the fields, the corresponding standard pulse sequence can be called to the screen.

* * * * *

UNITED STATES PATENT AND TRADEMARK OFFICE
CERTIFICATE OF CORRECTION

PATENT NO. : 5,317,260
DATED : May 31, 1994
INVENTOR(S) : Arne Kasten and Günther Laukien It is certified that error appears in the above-indentified patent and that said Letters Patent is hereby corrected as shown below:

On the Title Page, the Inventor's name "Günter Laukien" should be --Günther Laukien--.

Column 4, line 27, "order t" should be --order to--.

Column 4, line 60, "per se" should be --per se,--.

Column 4, line 64, "$\Omega_0$." should be --$\Omega_0$,--.

Column 6, line 7, "this 20 respect" should be --this respect--.

Signed and Sealed this

Fifteenth Day of November, 1994

Attest:

BRUCE LEHMAN

*Attesting Officer*     *Commissioner of Patents and Trademarks*